United States Patent [19]

Little et al.

[11] Patent Number: 5,777,793
[45] Date of Patent: Jul. 7, 1998

[54] POLARIZATION INSENSITIVE MULTILAYER PLANAR REFLECTION FILTERS WITH NEAR IDEAL SPECTRAL RESPONSE

[75] Inventors: Brent E. Little, Boston, Mass.; Chi Wu, Nepean, Canada

[73] Assignee: Northern Telecom Limited, Montreal, Canada

[21] Appl. No.: 686,355

[22] Filed: Jul. 25, 1996

[51] Int. Cl.[6] .................................................. G02B 1/10
[52] U.S. Cl. ........................ 359/584; 359/589; 359/127; 385/127
[58] Field of Search ........................ 359/589, 127, 359/584, 588; 385/127

[56] References Cited

U.S. PATENT DOCUMENTS

| | | | |
|---|---|---|---|
| 3,759,604 | 9/1973 | Thelen | 359/589 |
| 4,247,167 | 1/1981 | Tokuhara et al. | 359/584 |
| 4,615,034 | 9/1986 | Von Gunten et al. | 359/588 |
| 5,179,468 | 1/1993 | Gasloli | 359/588 |

FOREIGN PATENT DOCUMENTS

A 63-98602  4/1988  Japan ..................... 359/588

OTHER PUBLICATIONS

Kobrinski et al., "Wavelength-Tunable Optical Filters: Applications and Technologies" IEEE Communications Magazine, (1989) pp. 53–63.

Haus, "Waves and Fields in Optoelectronics", Prentice–Hall Series in Solid State Physical Electronics, Chap. 3, pp. 55–77 & 80 and Chap. 8, pp. 235–249 & 253.

Kogelnik, "Filter Response of Nonuniform Almost–Periodic Structures", The Bell System Technical Journal, vol. 55, No. 1, (1976) pp. 109–126.

Cross et al., "Sidelobe Suppression in Corrugated-Waveguide Filters", Optics Letters, vol. 1, No. 1, (1977) pp. 43–45.

Alferness et al., "Filter Characteristics of Codirectionally Coupled Waveguides with Weighted Coupling", IEEE Journal of Quantim Electronics, vol. QE–14, No. 11, (1978) pp. 843–847.

Chen, "Optimised Design of Even–Order Optical Low–pass and High–pass Multilayer Filters by Method of Coefficient Matching", IEEE Proceedings, vol. 135, Pt. J, No. 5, (1988) 359–371.

Dobrowolski et al., "Optical Thin Film Synthesis Program Based on the Use of Fourier Transforms", Applied Optics, vol. 17, No. 19, (1978) 3039–3050.

Leo Young, "Multilayer Interference Filters with Narrow Stop Bands", Applied Optics, vol. 6, No. 2, pp. 297–315, Feb. 1967.

(List continued on next page.)

*Primary Examiner*—Paul M. Dzierzynski
*Assistant Examiner*—John Juba, Jr.
*Attorney, Agent, or Firm*—Foley & Lardner

[57] ABSTRACT

A polarization insensitive, multilayer planar reflection filter is provided having (I) strong sidelobe suppression, preferably with sidelobe suppression levels in the range of –30 dB to –50 dB, and (ii) minimum width of the filtered bandwidth for the specified sidelobe suppression level. The multilayer planar reflection filter is provided by a multilayer stack by specifying the manner in which the thickness of the individual dielectric layers are to be varied throughout the stack. The resulting universal design formula specifies these layer values for a stack with an arbitrary number of layers, dielectric constant, incident angle, and wavelength. In particular, the layer thickness values of the alternating layer $d_1(j)$ in refractive index $n_0$, and $d_2(j)$ in refractive index $n_0+\Delta n$, vary with each period j and are determined to provide a specified central wavelength, sidelobe suppression and minimum filtered band width. The filter is polarization insensitive because the period required for maximum reflection at wavelength $\lambda_0$ is the same for both TE and TM polarized light.

6 Claims, 13 Drawing Sheets

OTHER PUBLICATIONS

Alfred Thelen, "Multilayer Filters with Wide Transmittance Bands", J. Optical Soc. America, vol. 53, No. 11, pp. 1266–1270, Nov. 1963.

Alfred Thelen, "Design of Optical Minus Filters", J. Optical Soc. America, vol. 61, No. 3, pp. 365–369, Mar. 1971.

V.A. Efremenko, et al., "Possibility of Suppression of Reflection Peaks in Transmission Bands of Dielectric Mirrors", Sov. J. Quant. Electron., vol. 4, No. 8, pp. 1032–1034, Feb. 1975.

$\lambda_i$ = i-th wavelength channel

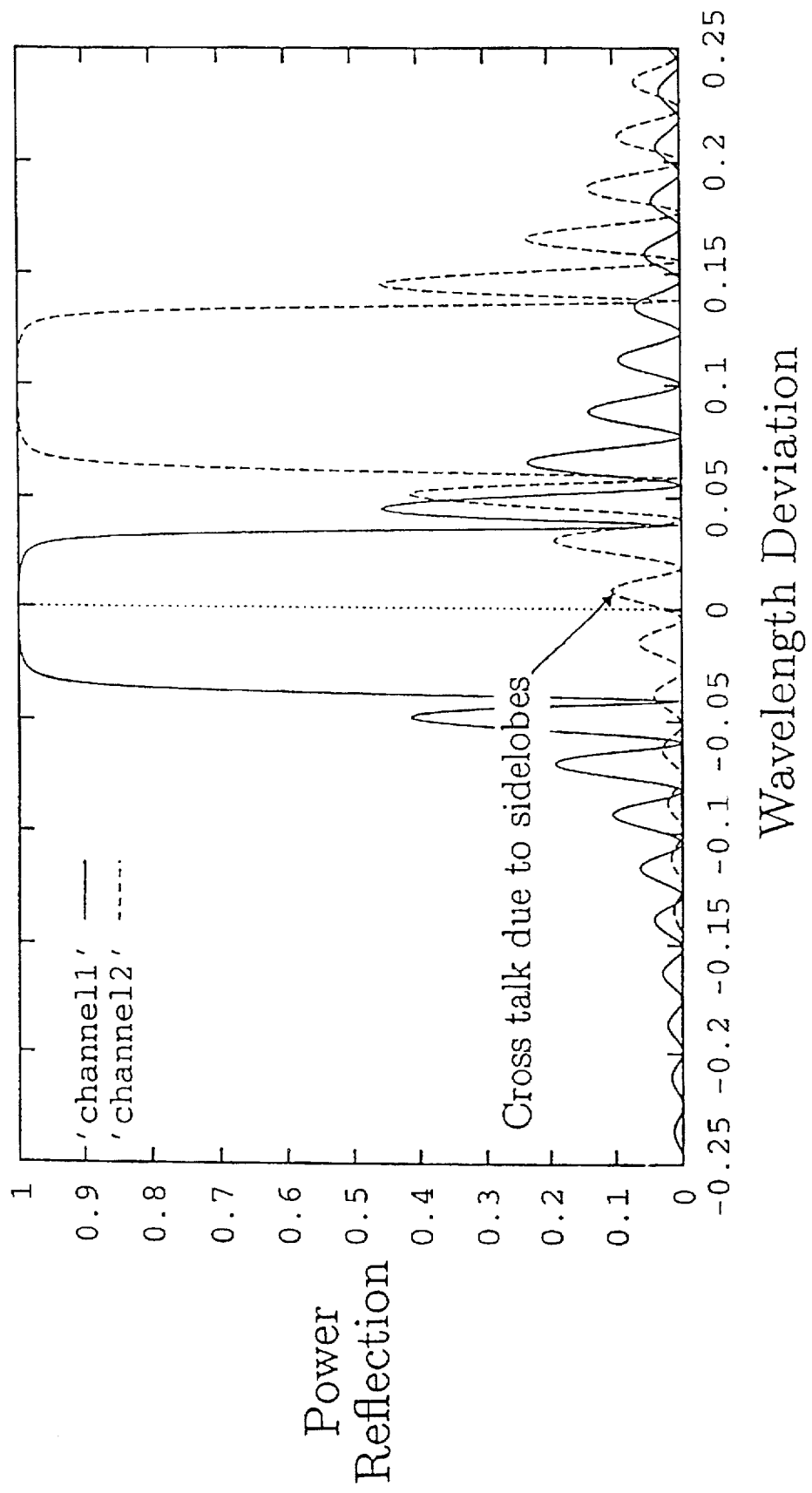

1

POLARIZATION INSENSITIVE MULTILAYER PLANAR REFLECTION FILTERS WITH NEAR IDEAL SPECTRAL RESPONSE

FIELD OF THE INVENTION

This invention relates to a multilayer planar reflection filter, and more particularly to a multilayer planar reflection filter having a near ideal, polarization insensitive, spectral response.

BACKGROUND OF THE INVENTION

The potential communication capacity of optical fibers operating in the low loss wavelength windows of 1.3 μm and 1.5 μm is in the order of tens of Terahertz. The practical utilization of this bandwidth may be realized through the use of wavelength division multiplexing (WDM), in which the spectral range is subdivided and allocated to different carrier wavelengths (channels) which are multiplexed onto the same fiber. The wavelength bandwidth that an individual channel occupies depends on a number of factors, including the impressed information bandwidth, and margins to accommodate for carrier frequency drift, carrier frequency uncertainty, and to reduce possible inter-channel cross-talk due to non-ideal filters.

The various wavelength channels in an optical fiber spatially overlap, and means must be sought to physically separate one or more of them at branch nodes or the terminal. Although an isolated optical fiber may inherently have tremendous information carrying capacity, the overall optical communication link may be significantly restricted in bandwidth. These restrictions may result from the limited optical amplifier spectral windows, the availability of lasing sources and limitations on their tuning ranges, and filter tuning ranges. Hence, to achieve efficient use of bandwidth requires that the available communications windows be densely filled with multiplexed channels. At the input and output of such a system, filters are needed to combine and separate wavelengths in individual channels. The performance of these wavelength selective filters, in their ability to filter one channel and reject out-of-band signals, is critical in determining channel spacing and hence channel density for WDM communications.

A device that separates a channel from the main fiber (bus) is called a channel dropping filter. Many channel dropping filters use interference effects, which are strongly wavelength dependent, to extract a particular signal, as described, for example in the following references: H. Kobrinski and K-W. Cheung, "Wavelength tunable optical filters: applications and technologies", IEEE Commun. Mag., p. 53, October 1989; H. A. Haus, in "Waves and fields in optoelectronics", Englewood Cliffs, N.J.: Prentice-Hall, 1984; H. Kogelnik, "Filter response of non-uniform almost-periodic structures", Bell Sys. Tech. J., vol. 55, pp. 109–127, 1976; P. S. Cross and H. Kogelnik, "Sidelobe suppression in corrugated-waveguide filter", Opt. Lett. vol. 1, pp. 43–45, 1977.; and, R. C. Alferness and P. S. Cross, "Filter characteristics of codirectionally coupled waveguides with weighted coupling", IEEE J. Quantum Elect., vol. QE-14, pp. 843–847, 1978.

Two examples of these wavelength selective devices are the distributed feedback (DFB) filter and the codirectional coupled filter. A distributed feedback filter coupler acts like a wavelength selective mirror having a corrugation (grating) period which is chosen to reflect a particular wavelength. One known form of directional coupler comprises separate parallel waveguides. Waveguide modes are evanescently coupled from the input waveguide to the output guide. This coupling is wavelength dependent. The typical wavelength or spectral response (i.e. reflected power and transmitted power as a function of wavelength) for each of these devices is shown in FIGS. 3a and 3b respectively. The response of the DFB filter (FIG. 3a) is characterized by a stopband, a portion of the spectrum over which strong reflection occurs. The response of the directional coupler is SINC-function like, and is characterized by a quadratic type passband. The spectral response of each of these devices exhibits large sidelobes outside of the respective filtered bandwidth. These sidelobes are undesirable, because they contribute to cross-talk, i.e. interference between closely spaced channels, thereby restricting channel density and hence communications capacity.

Another type of channel dropping filter that is of interest here is a multilayer reflection filter which comprises a stack of planar dielectric layers. A multilayer planar reflection filter is formed by layers of thin films of varying refractive index and layer thicknesses. For example, the layers alternate in thickness $d_1$ and $d_2$ and refractive index, and act as a planar mirror. Appropriate choice of layer thickness results in strong reflection at a particular wavelength, a particular wavelength being reflected strongly at a certain incident angle θ. Stacks may be designed with different layer thickness to allow extraction of different wavelengths and subsequent reflection into output fibers or detectors. The typical spectral response of these multilayers is similar to that of a DFB filter.

Design considerations in channel dropping filters are focussed towards achieving a desired spectral response. The ideal filter response for current optical communication systems is known as the 'box' or 'window' function. This ideal filter is characterized by having perfect (unity) filtering of the wavelength band of interest, fast roll-off of the response along the edges of the band, and zero transmission of signals outside of the band. On the other hand, the typical filter response of interference filters are non-ideal. They have large sidelobes outside of the filter bandwidth. These sidelobes limit the spacing of adjacent channels, since a sidelobe of one filter that falls in the filtered band of another causes inter-channel cross-talk. To avoid this cross-talk, wavelength channels must be widely spaced by unused portions of the spectrum. This places a severe restriction on channel density and hence communication capacity, and methods are sought to improve the performance of these filters.

SUMMARY OF THE INVENTION

The present invention seeks to provide a polarization insensitive, multilayer planar reflection filter having (i) strong sidelobe suppression, preferably with sidelobe suppression levels in the range of −30 dB to −50 dB, and (ii) minimum width of the filtered bandwidth for the specified sidelobe suppression level.

According to one aspect of the present invention there is provided a multilayer planar reflection filter comprising:

a multilayer stack comprising N periods of alternating layers of a first dielectric media of index $n_0$ and a second dielectric medium of index $n_0+\Delta n$, the value of N being odd, the thicknesses of each layer of period j of refractive index $n_0$ having a thickness $d_1(j)$, and of each layer of period j in refractive index $n_0+\Delta n$ having a thickness $d_2(j)$, the thicknesses of each layer $d_1(j)$ and $d_2(j)$ being selected to provide a filter response having a filtered bandwidth at a selected central wavelength $\lambda_0$, a specified out-of-band sidelobe suppression ratio S, and a minimum width of the filtered bandwidth for the specified level of sidelobe suppression.

Thus a multilayer planar reflection filter is provided by a multilayer stack by specifying the manner in which the thickness of the individual dielectric layers are to be varied throughout the stack. The resulting universal design formula specifies these layer values for a stack with an arbitrary number of layers, dielectric constant, incident angle, and wavelength.

According to another aspect of the present invention there is provided a multilayer planar reflection filter comprising:

a multilayer stack comprising N periods of alternating layers of a first dielectric medium of index $n_0$ and a second dielectric medium of index $n_0+\Delta n$, the value of N being arbitrary, but odd, a layer of period j of refractive index $n_0$ having a thickness $d_1(j)$, and a layer of period j in refractive index $n_0+\Delta n$ having a thickness $d_2(j)$, the individual thicknesses of each layer $d_1(j)$ and $d_2(j)$ being selected to provide a filtered bandwidth at a central wavelength $\lambda_0$, an out-of-band sidelobe suppression ratio S of better than −30 dB, and a minimum width of the filtered bandwidth for the specified level of sidelobe suppression.

In particular, the distribution is specified for dielectric layer thickness values in a multilayer stack, where the stack is composed of N periods of two alternating layers of index $n_0$ and $n_0+\Delta n$. The value of N is arbitrary, but odd. The thickness of the alternating layers $d_1(j)$ in refractive index $n_0$, and $d_2(j)$ in refractive index $n_0+\Delta n$, for period j are given by $$d_1(j) = n_0 \left( \frac{\pi}{2} - \Delta\phi(j) \right) \frac{\lambda_0}{2\pi} \cos\theta_1$$

$$d_2(j) = (n_0 + \Delta n) \left( \frac{\pi}{2} + \Delta\phi(j) \right) \frac{\lambda_0}{2\pi} \cos\theta_2$$

where $\lambda_0$ is the central wavelength of the filtered bandwidth, and $\theta_1$ is the incident angle of the optical wave measured with respect to the normal of the stack, (in index $n_0$) ; the angle $\theta_2$ is the propagation angle in the layers with index $n_0+\Delta n$, related to $\theta_1$ by Snell's law $n_0 \sin \theta_1 = (n_0+\Delta n) \sin \theta_2$. The values of $\Delta\phi(j)$ are specified by the design formulae $$\Delta\phi(j) = \cos^{-1} [\kappa(z_j)]$$

$$\kappa(z_j) = L_0(z_j) + SL_1(z_j) + S^2 L_2(z_j)$$

and $$z_j = \frac{N+1-2j}{N},$$

where j is the jth period of the N period stack, S is the desired level of sidelobe suppression in absolute decibels |dB| in the range of 30 dB to 50 dB. $L_k(z_j)$ are functions of coordinate $z_j$ given by $$L_k(k_j) = \sum_{i=0}^{5} b_{k,i} \cos z_j \pi(i + 1/2)$$

and the constant coefficients $b_{k,i}$ are set out below

| $b_{k,i}$ | 0 | 1 | 2 | 3 | 4 | 5 |
|---|---|---|---|---|---|---|
| $b_{0,i}$ | 0.8263 | −0.20689 | 4.28e-2 | −4.117e-2 | 5.993e-2 | −4.570e-2 |
| $b_{1,i}$ | 4.320e-3 | 9.064e-3 | −2.645e-3 | 2.229e-3 | −2.681e-3 | 2.003e-3 |
| $b_{2,i}$ | −3.200e-5 | −6.579e-5 | 9.90e-6 | −2.342e-5 | 2.836e-5 | −2.158e-5 |

The magnitude of the power reflection coefficient with this design formula is 99.9% at $\lambda_0$, the center of the stopband.

This imposes the following constraint on the index contrast $\Delta n$, the incident angle $\theta_1$, and the number of layers N:

*TE Modes:*

$$\Delta n = \left[ \frac{n_o^2(1 + P^2(s)) + 2P(s)n_o^2(\sin^2\theta_1 - \cos^2\theta_1)}{(1 + P^2(s))} \right]^{1/2} - n_o$$

*TM Modes:*

$$\Delta n = \left[ \frac{2n_o^2 \sin^2\theta_1}{1 - \sqrt{1 - 4\left(\frac{1-P(s)}{1+P(s)}\right) \sin^2\theta_1 \cos^2\theta_1}} \right]^{1/2} - n_o$$

and P(s) is a function of the sidelobe level S given by $$P(s) = \left[ \frac{4}{N(1.172 - (3.65 \times 10^{-5})s + (4.705 \times 10^{-7})s^2)} \right]$$

The filter is polarization insensitive because the period required for maximum reflection at wavelength $\lambda_0$ is the same for both TE and TM polarized light.

Another aspect of the present invention provides a channel dropping filter comprising a series of multilayer planar reflection filter elements, having layer thicknesses determined as described above, each having a spectral response having a different central wavelength, sidelobe suppression greater than −30 dB and minimum width for the filtered bandwidth.

Thus improved polarization insensitive multilayer reflection filters are provided which provide near ideal spectral response.

BRIEF DESCRIPTION OF THE DRAWINGS

FIG. 2(a) shows the physical form of a distributed feedback filter coupler, which acts like a wavelength selective mirror having a corrugation period which is chosen to reflect a particular wavelength as shown schematically in FIG. 2(b); FIG. 2(c) shows the physical form of a known directional coupler and FIG. 2(d) shows schematically how waveguide modes are evanescently coupled from the input waveguide to the output guide;

FIG. 7 shows the spectral response of two non-ideal wavelength filters placed in close proximity;

FIG. 11a shows the normalized coupling strengths $\kappa_j$ for each layer j of the 41 layer multilayer stack; FIG. 11b shows the reflected power response in a linear scale and FIG. 11c shows the reflected power response in a logarithmic scale.

FIG. 12a shows the normalized coupling strengths $\kappa_j$ for each layer j of the 41 layer multilayer stack; FIG. 12b shows the reflected power response in a linear scale and FIG. 12c shows the reflected power response in a logarithmic scale.

FIG. 13a shows the normalized coupling strengths $\kappa_j$ for each layer j of the 41 layer multilayer stack; FIG. 13b shows the reflected power response in a linear scale and FIG. 13c shows the reflected power response in a logarithmic scale.

DETAILED DESCRIPTION OF EMBODIMENTS

Figure 1:
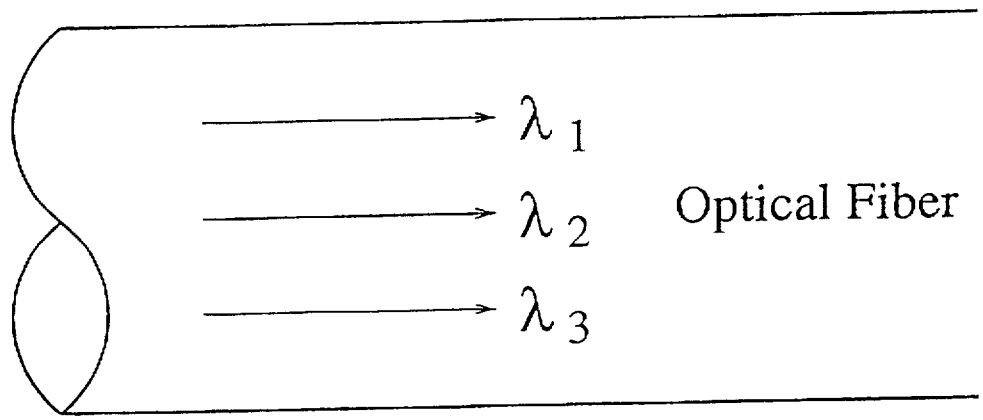
FIG. 1 shows a schematic diagram illustrating wavelength division multiplexing (WDM)

A diagram representing an optical fibre carrying multiple channels of different wavelength, $\lambda_i$ is shown in FIG. 1 to illustrate how wavelength division multiplexing (WDM) involves transmitting many channels simultaneously, each channel being carried by a distinct optical wavelength.

Figure 2B:
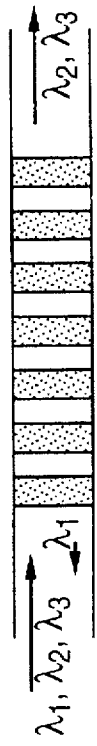
FIGS. 2a to 2d shows schematically known types of channel dropping filters and their mode of operation.
Figure 2D:
Figure 2A:
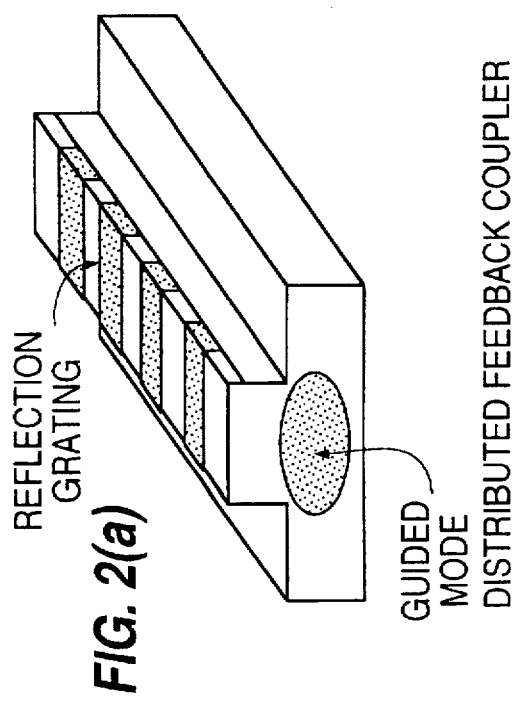
Figure 2C:
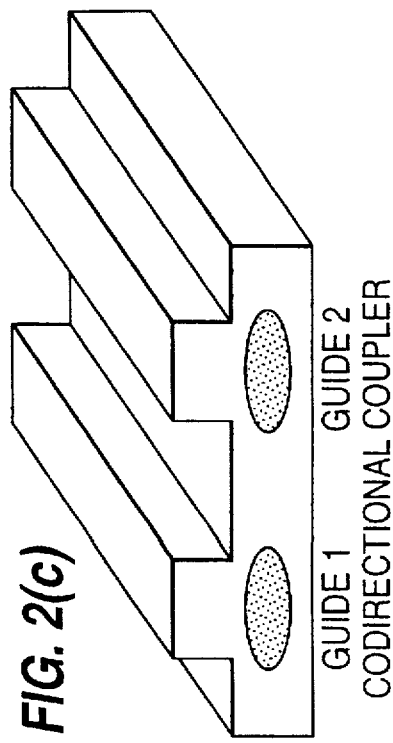

Two known examples of channel dropping filters are shown in FIGS. 2a to 2d. A distributed feedback filter (DFB) is shown in FIG. 2a, and acts like a wavelength selective mirror, as shown schematically in FIG. 2b. The corrugation period of the grating is chosen to reflect a particular wavelength. A directional coupler is shown in FIG. 2c and comprises two parallel waveguides. Waveguide modes are evanescently coupled from the input waveguide to the output guide, as shown schematically in FIG. 2d. This coupling is wavelength dependent.

Figure 3A:
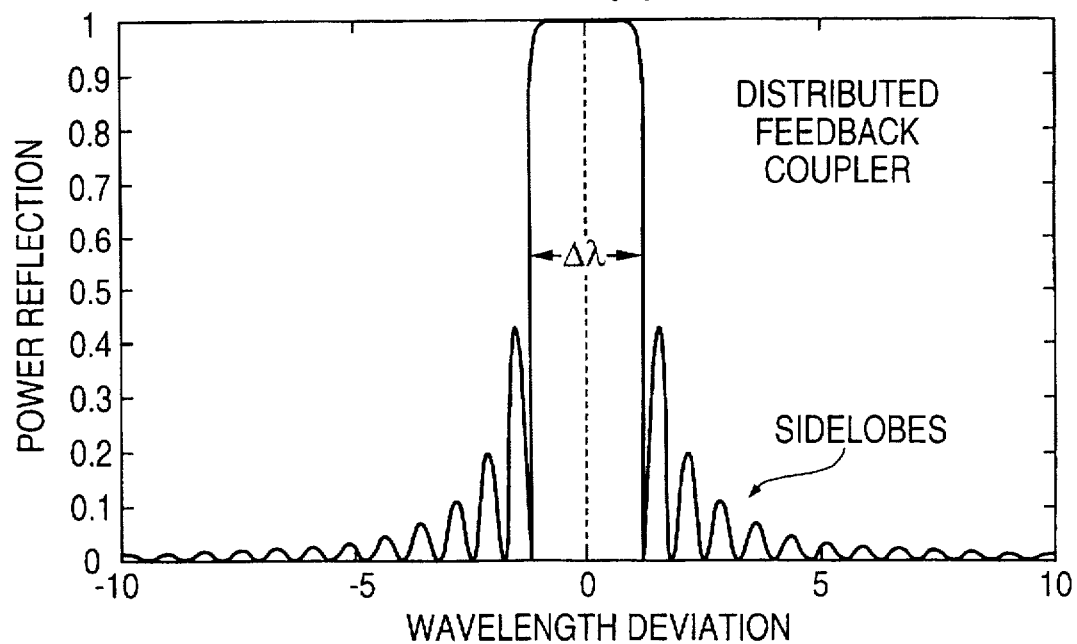
FIGS. 3a and 3b show respectively the spectral response for the filters of FIG. 2a and 2c respectively.
Figure 3B:
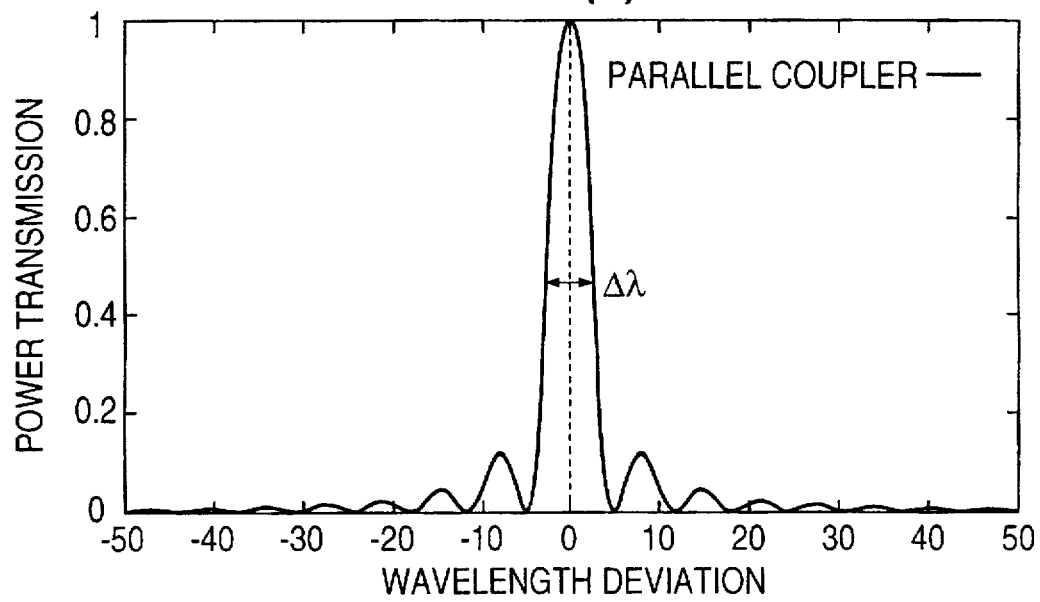

The wavelength (spectral) response of the filters shown in FIGS. 3a and 3b. The response of the DFB filter is characterized by a stopband, that is a portion of the spectrum over which strong reflection occurs (FIG. 3a). The response of the directional coupler is SINC-function like (FIG. 3b), and is characterized by a quadratic type passband. Both spectra exhibit large sidelobes outside of their respective filtered bandwidths, which as mentioned above, contribute to crosstalk between closely spaced channels.

Figure 4:
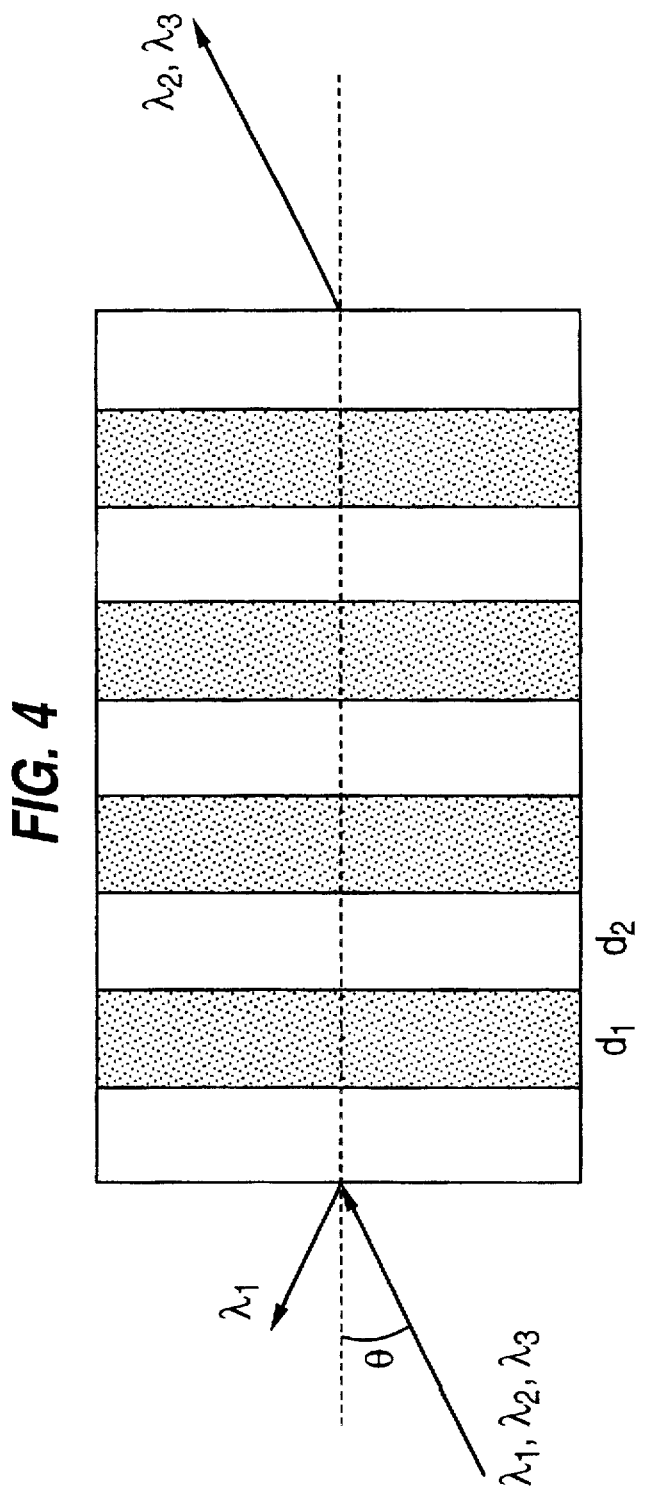
FIG. 4 shows schematically a planar dielectric mirror formed by layers of thin films of varying refractive index and layer widths $d_1$ and $d_2$.

A schematic representing a conventional multilayer reflection filter comprising a multilayer dielectric stack is shown in FIG. 4 and includes a plurality of layers of thin films of varying index $n_1$ and $n_2$ and layer widths $d_1$ and $d_2$ which form a planar dielectric mirror. A particular wavelength $\lambda_1$ with a certain incident angle q is strongly reflected, due to constructive reflections of many periodic layers.

Figure 5A:
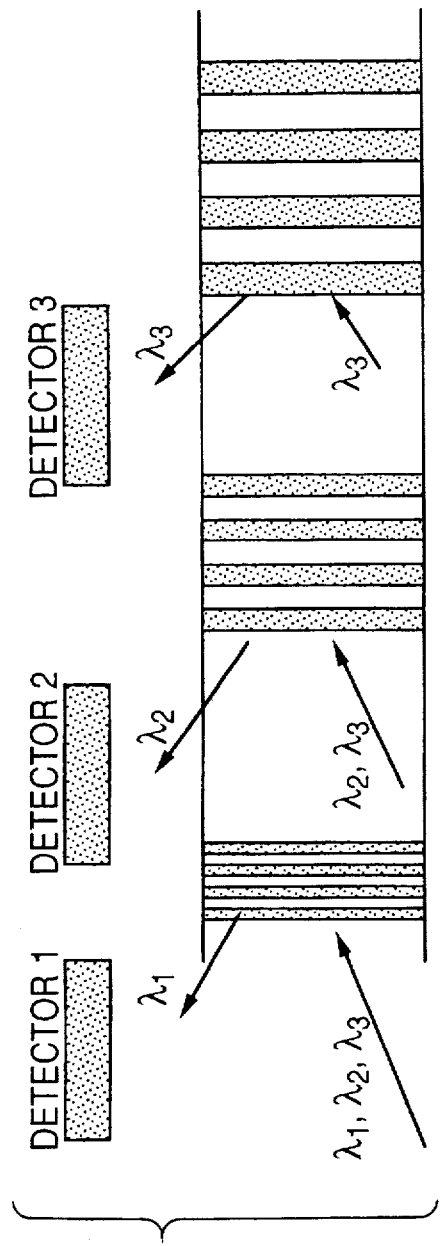
FIGS. 5a and 5b shows schematically a channel dropping filter network consisting of stacks of wavelength selective dielectric mirrors in which wavelength channels are directed towards detectors or output fibers: the multilayer reflection filter of FIG. 5a comprises stacks that are co-linear and that of FIG. 5b comprises stacks that are tilted.
Figure 5B:
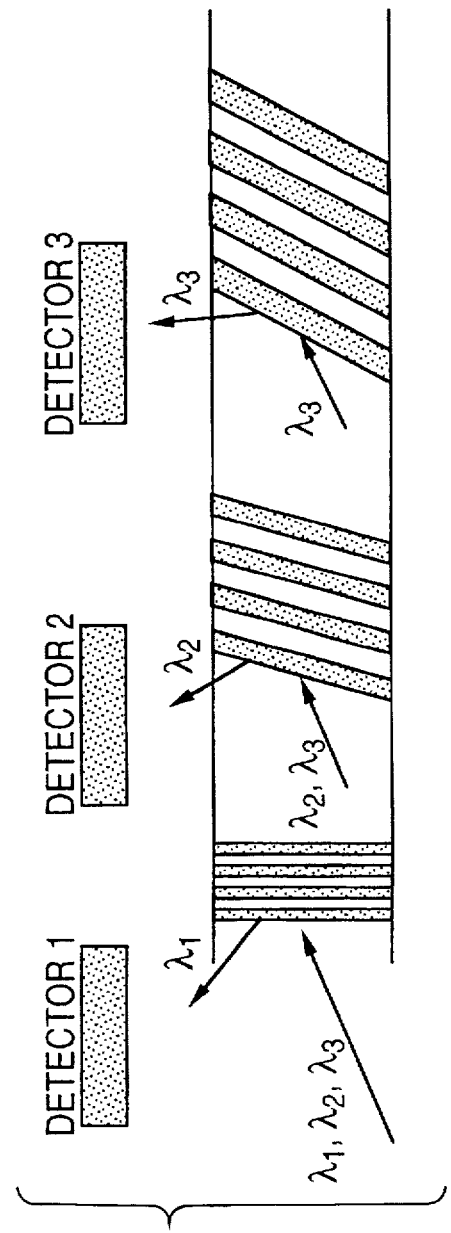

A known channel dropping filter network comprising three cascaded reflection multilayer filter elements is shown schematically in FIGS. 5a and 5b. Each filter element comprises a stack of layers of particular thicknesses and indices, designed to provide wavelength selective dielectric mirrors, each of which reflect a specific wavelength. Individual wavelength channels are directed towards corresponding detectors D1, D2 and D3, or alternatively directed to output fibers. All the stacks of dielectric layers may be arranged co-linearly as shown in FIG. 5a, or tilted with respect to the longitudinal axis of the device as shown in FIG. 5b.

Figure 6:
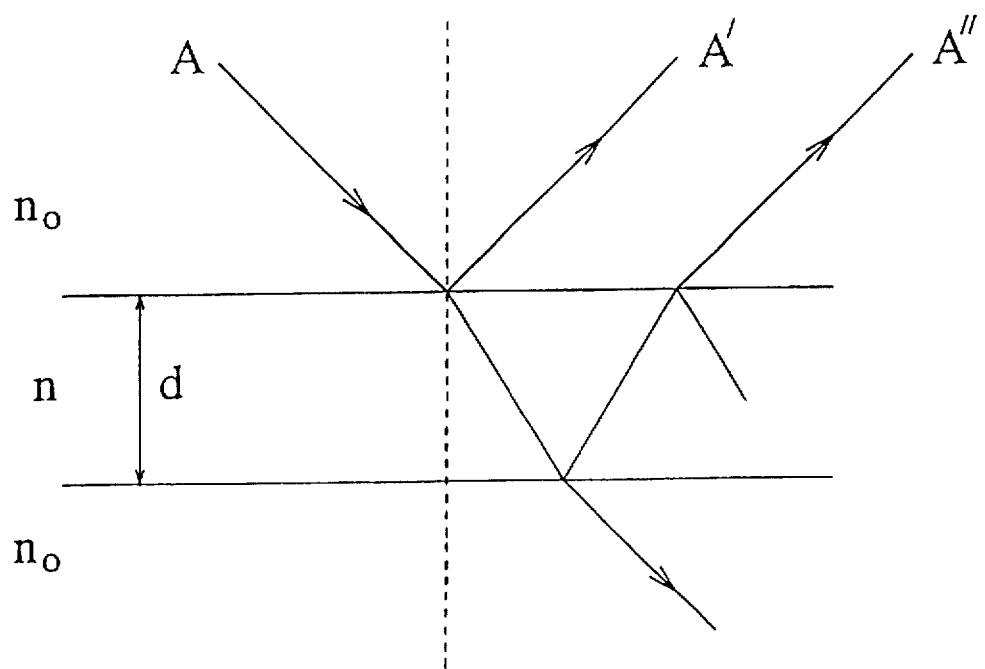
FIG. 6 shows schematically the reflection at interfaces between dielectric layers of different refractive indices.

FIG. 6 shows schematically how reflection occurs at the interfaces between dielectric layers of different refractive index. For an input wave A, the sum of all partial reflections may add constructively or destructively, depending on the layer thickness d. For an optimum layer depth d, all reflections are in phase, resulting in the maximum reflection for the index values chosen.

Considering the reflection from a dielectric layer of thickness d and index n shown in FIG. 6 the incident ray A is partially transmitted, and partially reflected at the surface. The transmitted part is also reflected off the bottom of the layer and emerges as ray A', coincident with the first reflection A". An electromagnetic wave is an oscillation, and has a phase associated with its amplitude. This phase is directly related to the distance over which the wave propagates. Thus, the phase of the second reflection A" (and all subsequent reflections) can be adjusted relative to the first A' by varying the layer thickness d. The net reflected wave is a sum of all the partial reflections. This net reflection is maximized when all partial waves add constructively. In particular, this occurs when $d=\lambda/4 \cos \theta$, known as a quarter wavelength, where l is the wavelength, and q is the incident angle. Wavelength selectivity of this dielectric mirror is hence established from the optimum value of d, which is wavelength dependent.

The index difference $\Delta n = n_0 - n_1$ of the layer shown in FIG. 6 is typically small, and so even the optimum thickness d produces a very small net reflection. The overall reflection is increased by cascading many quarter-wave layers to form the multilayer-layer stack shown in FIG. 4. The wavelength-response of the typical N-layer stack of quarter-wave layers is shown in FIG. 3a. The spectrum has a bandwidth of $\Delta\lambda$ (called the stopband), in which the reflection is characterized by a flat, near unity reflection.

Outside of the stopband the spectrum consists of a series of sidelobes of descending amplitude. The bandwidth $\Delta\lambda$ is determined entirely by the index contrast $\Delta n$, while the reflection strength is related to the product of $\Delta n$ and the number of layers N. The amplitude and distribution of sidelobes depends on the number of layers, their thickness and $\Delta n$. The sidelobes of the filter response shown in FIG. 3a are undesirable. They lead to inter-channel cross-talk when two wavelength filters are placed in close proximity as depicted in FIG. 7. These sidelobes are typical of interference type filters. Channels must be separated by guard bands of unused portions of spectrum to minimize this cross-talk. This considerably reduces information capacity because the sidelobes decrease at a slow rate with wavelength, thus requiring large wavelength depleting guard bands. For current communications purposes, the sidelobe suppression better than −30 dB is required.

Means must be sought to suppress sidelobes since these limit communication system performance. Sidelobes occur because certain wavelengths experience constructive reflections over several periods of the multilayer stack, but not over the entire device. Strong, but not unity, reflection can then occur.

Layer thickness critically determines which wavelengths experience strong partial reflections. Since layer thickness is a design variable that can be manipulated, varying each layer throughout the device in a specified way can suppress the sidelobes. Similar methods have been used in the synthesis of other interference filters as discussed by R. C. Alferness and P. S. Cross, in "Filter characteristics of codirectionally coupled waveguides with weighted coupling", IEEE J. Quantum Elect., vol. QE-14, pp. 843–847, 1978; J. A. Dobrowolski and D. Lowe, "Optical thin film synthesis program based on the use of Fourier transforms," Appl. Optics, vol. 17, pp. 3039–3050, 1978; T. C. Chen, "Optimized design of even-order optical low-pass and high-pass multilayer filters by method of coefficient matching.", IEE Proc., vol.135, Pt.J, no. 5, pp. 359–371, 1988; and in the references mentioned above to Kogelnik, and Cross and Kogelnik.

Solving for the required distribution of layers to achieve an ideal response is the subject of primary interest in all filter synthesis techniques. The required distribution function for our multilayer reflection filter device is solved exactly for the first time as described below.

Figure 10:
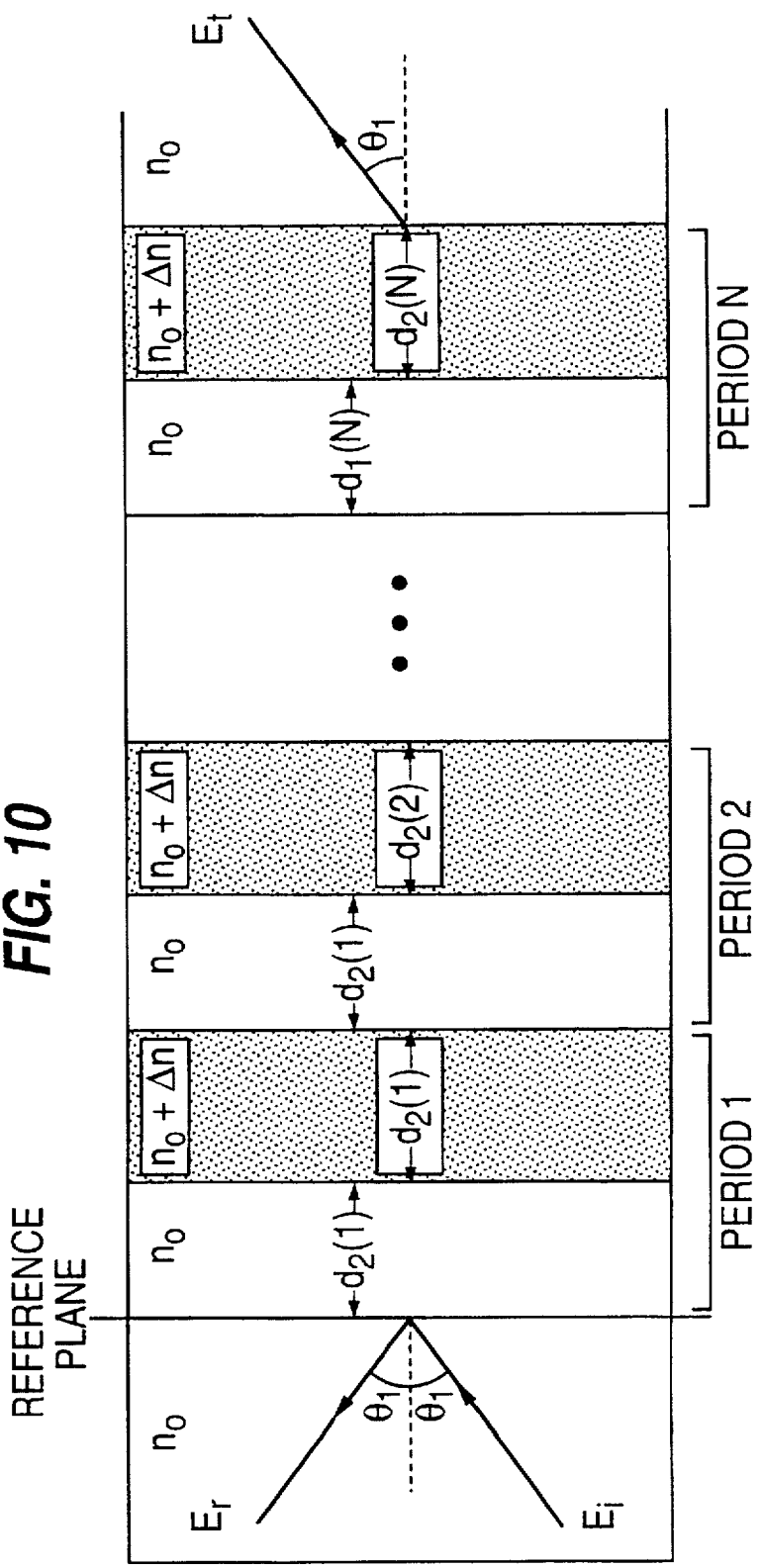
FIG. 10 shows a detailed schematic of a single multilayer reflection filter. The filter comprises alternating layers of index values $n_0$ and $n_0+\Delta n$. The layer widths are given by $d_1(j)$ for layers of index $n_0$, and by $d_2(j)$ for layers of index, for period j. The incident angle is $\theta_1$.

As a starting point for the design of a near ideal multilayer filter, a detailed schematic of a single multilayer reflection filter is shown in FIG. 10 and the filter comprises alternating layers of index values no and $n_0+\Delta n$. The layer widths are given by $d_1(j)$ for layers of index $n_0$, and by $d_2(j)$ for layers of index $n_0+\Delta n$, for period j, and incident angle is $\theta_1$. The significant features of operation of this filter will be described qualitatively. The non-ideal spectral response of all interference type filters, and methods to improve this response, will then be described. The mathematical description and synthesis methods are described in the following section.

Exact Theory of Plane Wave Reflection Filters

Figure 8A:
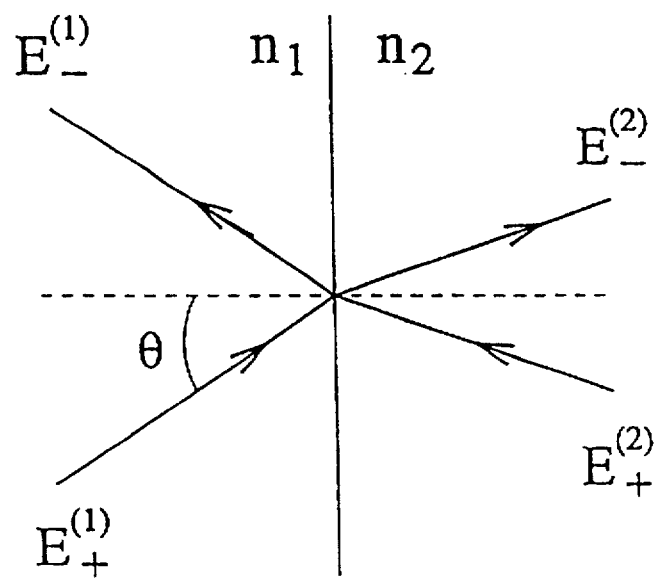
FIG. 8 represents schematically how the theory of reflections at a dielectric interface as shown in FIG. 8a may be cast in the form of transmission line equivalent of FIG. 8b.

The exact theory of the multilayer reflection filter is the theory of cascaded reflections of the type shown in FIG. 8a which represents reflection at one interface. The reflection coefficient $\Gamma$ at the interface is defined as the ratio of reflected field amplitude $E_-^{(1)}$ to input field amplitude $$\Gamma = \frac{E_-^{(1)}}{E_+^{(1)}}, \tag{1}$$

The theory of such reflections is well known, and for example is discussed in the above mentioned reference to Wagner et al. The theory of reflections at a dielectric interface as represented schematically in FIG. 8a may be cast in the form of transmission lines equivalent shown schematically in FIG. 8b. The equivalence is exact. The transformation takes place via the characteristic impedances $Z_{o,j}$. A multilayer reflection filter may be represented by a filter network composed of a cascaded series of equivalent transmission lines (FIG. 9), in which each transmission line represents a dielectric layer. The net reflection coefficient $\Gamma$ may be obtained by transforming the last reflection coefficient $\Gamma_N$ across all prior interfaces.

Figure 8B:
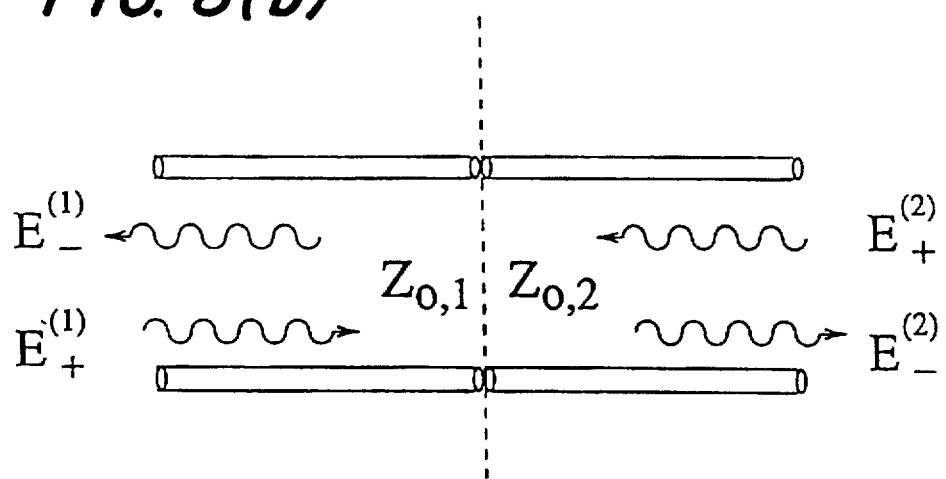
Figure 9:
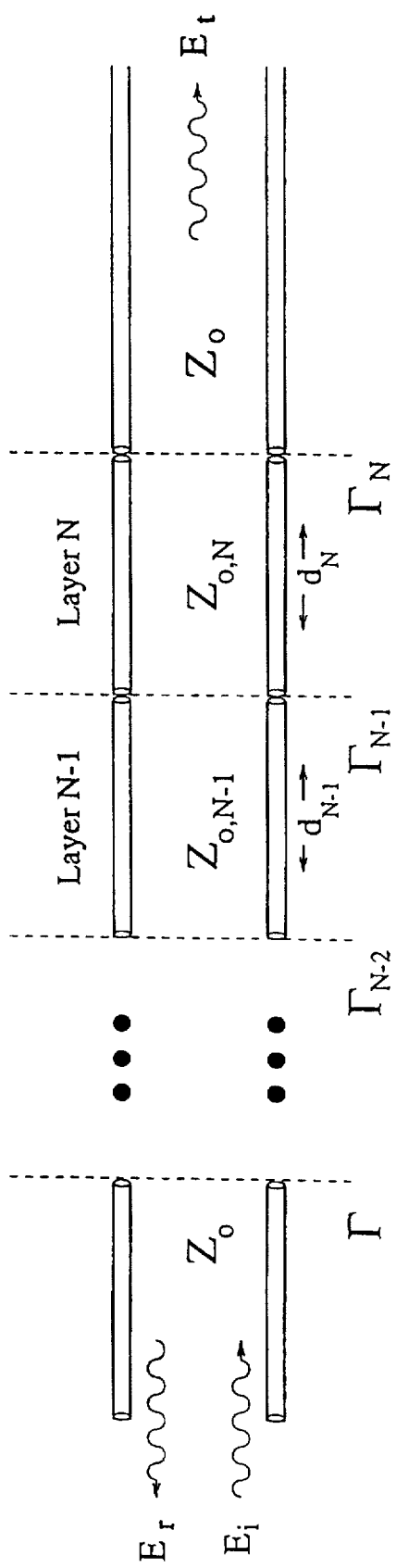
FIG. 9 shows an equivalent filter network composed of a cascaded series of equivalent transmission lines in which each transmission line represents a dielectric layer to show how the net reflection coefficient $\Gamma$ may be obtained by transforming the last reflection coefficient $\Gamma_N$ across all prior interfaces.

The theory of impedances represents an equivalent transmission line formulation to electromagnetic problems. The equivalence here is exact, and has the virtue of casting the problem in a more general form. Thus, the equivalent transmission line of the interface problem of FIG. 8a is represented in FIG. 8b and the characteristic impedances $Z_0^{(1)}$ and $Z_0^{(2)}$ are TE modes:

$$Z_0^{(1)} = \sqrt{\frac{\mu_0}{\epsilon_0}} \; \frac{1}{n_1 \cos\theta_2} \tag{2a}$$

$$Z_0^{(2)} = \sqrt{\frac{\mu_0}{\epsilon_0}} \; \frac{1}{n_2 \cos\theta_2} \tag{2b}$$

TM modes:

$$Z_0^{(1)} = \sqrt{\frac{\mu_0}{\epsilon_0}} \; \frac{n_1}{_1\cos\theta_1} \tag{3a}$$

$$Z_0^{(2)} = \sqrt{\frac{\mu_0}{\epsilon_0}} \; \frac{n_2}{\cos\theta_2} \tag{3b}$$

where $\mu_0$ is the permeability of free space, and $\epsilon_0$ is the permittivity of free space. TE and TM modes refer to the polarization of the electric field with respect to the lane of incidence.

The transmission angle $\theta_2$, is given in terms of the incident angle $\theta_1$ by Snell's law: $n_1 \sin\theta_1 = n_2 \sin\theta_2$. For a wave incident from medium 1 onto semi-infinite medium 2, the reflection coefficient is $$\Gamma = \frac{Z_0^{(2)} - Z_0^{(1)}}{Z_0^{(2)} + Z_0^{(1)}} \tag{4}$$

The generalization to multiple reflecting layers follows from generalized impedance transformations. The total reflection coefficient of the device is constructed by transforming the reflection coefficient of the last interface successively across all dielectric layers. Consider the multi-segment transmission line in FIG. 9. The reflection coefficient $\Gamma_N$ of the last interface is evaluated by equation (4). This reflection can be transformed over the layer to the preceding (N−1) interface by the formula $$\Gamma_{N-1} = \frac{(Z_0^{(N)} - Z_0^{(N-1)}) + (Z_0^{(N-1)} + Z_0^{(N)}) \Gamma_N e^{-j\phi_N}}{(Z_0^{(N)} + Z_0^{(N-1)}) + (Z_0^{(N)} - Z_0^{(N-1)}) \Gamma_N e^{-j\phi_N}} \tag{5}$$

where $Z_o^{(N)}$ and $Z_o^{(N-1)}$ are the characteristic impedances of the N and N−1 layers, evaluated by equations (2) or (3), and $\phi_N$ is the phase accumulation over the layer given by $$\phi_N = 2k_N d_N \tag{6a}$$

$$k_N = \frac{2\pi}{\lambda} n_N \cos\theta_N \tag{6b}$$

where $d_N$ is the layer thickness, $k_N$ is the propagation constant along the interface normal, $n_N$ is the refractive index, and $\theta_N$ is the angle of propagation, all in layer N. $\theta_N$ is related to the incident angle $\theta_1$ by Snell's law. Thus, starting with the known value of $\Gamma_N$, the reflection of the entire multilayer stack $\Gamma_0$, is evaluated by repeatedly applying the transformation (5), with the parameter constants in (6). This formulation is general because the actual device parameters appear as normalized quantities in the characteristic impedances given by equations (2) and (3) and phase constant of equation (6).

Filter Response

Strong reflection occurs in a multilayered medium when the layers are periodic. A period is formed by two alternating layers with the criteria that at the desired wavelength, $$2k_1 d_1 + 2k_2 d_2 = \pi \tag{7}$$

where $k_i$ is the propagation constant of the i-th layer given in (6b). This may be written in the more general form $$\phi_1 + \phi_2 = \pi \tag{8}$$

where $\phi_i = 2k_i d_i$. If $\phi_1 = \phi_2 = \pi/2$, the layer thicknesses are known as quarter wavelengths. Alternatively, setting $$\phi_1 = \pi/2 + \Delta\phi \tag{9a}$$

$$\phi_2 = \pi/2 - \Delta\phi \tag{9b}$$

$$\Delta\phi = 2k_1 \Delta d_1 = 2k_2 \Delta d_2 \tag{9c}$$

then the criteria of equation (8) is still satisfied. $\Delta d_1$ and $\Delta d_2$ are the changes in layer thickness needed to produce the phase change $\Delta\phi$. By appropriately adjusting $\Delta\phi$ from period to period along the entire filter, that part of the spectrum that lies outside of the stopband can be manipulated. In particular, the sidelobes can be suppressed. The foregoing relations apply to both TE and TM polarizations, hence the reflection filter is polarization insensitive. The wavelength $\theta_0$ for which (8) is satisfied is at the center of the stopband or reflection spectrum. The net reflectivity at this wavelength in particular is $$\Gamma = \tanh\left[\sum_i |\Gamma_i| \kappa_i\right] \tag{10a}$$

$$\kappa_i = \cos\Delta\phi_i \tag{10b}$$

where $\Gamma_i$ is the reflection at the i-th interface given by equation (4), $\Delta\phi_i$ are the deviations away from $\pi/2$ defined in equation (9), and $\kappa_i$ are referred to as normalized coupling coefficients. When the device is composed of alternating layers of two index values, then all $|\Gamma_i|$ are the same and $|\Gamma_i| = \Gamma_o$. For a desired reflectivity $\Gamma$, the quantity $$\Gamma_o \sum_i \kappa_i$$

is conserved. For example, if the number of layers are doubled, then choosing index values to make $\Gamma_o$ half of its original value results in the same reflection at wavelength $\theta_o$. When $\phi_i$ is the same in all periods (alternate layers have identical thickness) the resulting spectrum is similar to that shown in FIG. 3a.

Theoretical Derivations of Filter Synthesis

The objective of the present work is to produce a general design formula for the distribution of layer thickness in the multilayer reflection filter giving any degree of sidelobe suppression in the range of −30 dB to −50 dB. The response of these filters is to also have the minimum possible bandwidth achievable at the desired sidelobe suppression level, (in order to-accommodate the maximum number of optical communications channels). The method of variational-optimization is used to produce the desired result. This method has been previously developed by the present inventors for the synthesis of transmission type wavelength filters with very low sidelobes as discussed in copending patent applications Ser. Nos. (08/385,419, 08/551,470 and (08/548,304.

It is assumed for theoretical purposes that we start with some non-ideal distribution of coupling coefficients $\kappa_o(z)$. The normalized coupling coefficients of each layer were defined in equation (10b) and are here related to $\kappa_o(z)$ by $$\kappa_j = \kappa_o(z_j), z_j = \frac{j}{N} \tag{11}$$

where N is the number of layers.

The following error vector is then defined:

$$E(\kappa_o) = [\epsilon(\kappa_o), \epsilon_1(\kappa_o), \ldots, \epsilon_m(\kappa_o),] \tag{12}$$

The component $\epsilon_i, \{i=1 \ldots m\}$ either described the error between the desired sidelobe level and the current sidelobe level for shape $\kappa_o$ and sidelobe i. Algebraically, $\epsilon_i = (\sigma_i - \rho_i)$ where $\sigma_i$ is the desired sidelobe level for sidelobe i, and $\rho_i$ is the current level for sidelobe i. The total number of points m may be arbitrarily chosen to cover the wavelength range of interest.

The arbitrary coupling coefficient is represented as $$\kappa(z) = \Sigma^N a_n f_n(z),$$

where $f_n$ is an arbitrary set of functions. Again $\kappa_j = \kappa(z_j)$, similar to equation (11). Here there are trigonometric functions. The unknowns are the coefficients $a_n$ which are written in a vector, $\vec{\kappa} = (a_1, a_2 \ldots a_N)$. Given an initial state $\vec{\kappa}_o$, an improvement to $\vec{\kappa}_o$ denoted by $\vec{\kappa}^* = \vec{\kappa}_o + \Delta\vec{\kappa}$ is found by evaluating the incremental improvement vector $\Delta\vec{\kappa}$, $$\Delta\vec{\kappa} = \alpha j^T (jj^T)^{-1} E(\vec{\kappa}_o) \tag{13}$$

where $$J_{ij} = \frac{\partial \epsilon_i}{\partial k_j}$$

is the Jacobi matrix, and $\alpha$ is a scaling parameter used to decelerate the convergence. Equation (13) is repeatedly applied until a satisfactory optimization is achieved. Hence the optimum value is analytically given by the function: $\kappa(z) = \Sigma a_n f_n(z)$.

Achieving the desired sidelobe level is the first criteria in filter synthesis. The second is to obtain the narrowest bandwidth while still maintaining the maximum tolerable sidelobe level.

Thus, defining the coupler bandwidth B, as a function of the levels of all sidelobes $B=B(s_1,s_2,s_3,\ldots)$ where $s_j$ is the absolute value of sidelobe j., the gradient of B with respect to vector $\vec{S}=(s_1,s_2,s_3,\ldots)$ is then evaluated:

$$\vec{W}(s) = \nabla_s B = \left( \frac{\partial B}{\partial s_1}, \frac{\partial B}{\partial s_2}, \ldots \right) \quad (14)$$

$\vec{W}(\vec{i})$ is numerically shown to be positive definite, indicating that decreasing any sidelobe has the effect of increasing the bandwidth B. Hence for a desired maximum sidelobe level x, all sidelobes must be below x by definition, but to achieve the minimum bandwidth they should only be infinitesimally below x. This condition provides filters that are designed to have near theoretical optimum performance.

Design Formula for Planar Filter with Ideal Response

The multilayer filter of the first embodiment of the present invention comprises a plurality of dielectric layers, formed by a dielectric medium of refractive index $n_0$, in which are deposited N alternating planar layers of refractive index $n_0+\Delta n$, where N is an odd number. The index contrast $\Delta n$ between successive layers may be positive or negative. The device is arranged into N periods consisting of the two alternating layers of indexes $n_0$ and $n_0+\Delta n$, as shown in FIG. 10. The first period starts with an index of $n_0$ at the reference plane shown in FIG. 10. There is no index change across this reference plane. The last layer in period N has an index of $n_0+\Delta n$, beyond which is the background index $n_0$. The layer widths associated with the j-th period is $d_1(j)$ for the layer of index $n_0$, and $d_2(j)$ for the layer of index $n_0+\Delta n$. The angle of incidence is $\phi_1$, which is also the angle of propagation in all layers of index $n_0$. It is also the angle of transmission after the final period N. The angle of propagation in all layers of refractive index $n_0+\Delta n$ is $\theta_2$, which from Snell's law is $$\theta_2 = \sin^{-1}\left[ \frac{n_o \sin\theta_1}{n_0 + \Delta n} \right] \quad (15)$$

For a given central wavelength $\lambda_0$, incident angle $\theta_1$ and widths of the layers specified by equations (7) to (9) to be $$d_1(j) = n_0 \left( \frac{\pi}{2} - \Delta\phi(j) \right) \frac{\lambda_0}{2\pi} \cos\theta_1 \quad (16a)$$

$$d_2(j) = n_0 \left( \frac{\pi}{2} + \Delta\phi(j) \right) \frac{\lambda_0}{2\pi} \cos\theta_2 \quad (16b)$$

The objective of the filter design formula is to specify the distribution of the $\Delta\phi(j)$ for each period. Using the procedure outlined in the preceding section, the optimum distribution giving near optimal performance is $$\Delta\phi(j) = \cos^{-1}|\kappa(z_j)| \quad (17a)$$

$$\kappa(z_j) = L_0(z_j) + SL_1(z_j) + S^2 L_2(z_j) \quad (17b)$$

$$\text{and} \quad z_j = \frac{N+1-2j}{N}, \quad (17c)$$

where j is the jth period of the N period stack, S is the desired level of sidelobe suppression in absolute decibels |dB| in the range of 30 dB to 50 dB. $L_k(z_j)$ are functions of coordinate $z_j$ given by $$L_k(k_j) = \sum_{i=0}^{5} b_{k,i} \cos z_j \pi(i + 1/2) \quad (17d)$$

and the constant coefficients $b_{k,i}$ are given in Table 1.

TABLE 1

| $b_{k,i}$ | 0 | 1 | 2 | 3 | 4 | 5 |
|---|---|---|---|---|---|---|
| $b_{0,i}$ | 0.8263 | −0.20689 | 4.28e-2 | −4.117e-2 | 5.993e-2 | −4.570e-2 |
| $b_{1,i}$ | 4.320e-3 | 9.064e-3 | −2.645e-3 | 2.229e-3 | −2.681e-3 | 2.003e-3 |
| $b_{2,i}$ | −3.200e-5 | −6.579e-5 | 9.90e-6 | −2.342e-5 | 2.836e-5 | −2.158e-5 |

The magnitude of the power reflection coefficient is 99.9% at the center of the stopband, $\lambda_0$. This imposes the 10 following constraint on the index contrast $\Delta n$, the incident angle $\theta_1$, and the number of periods TE Modes:

$$\Delta n = \left[ \frac{n_o^2(1 + P^2(s)) + 2P(s)n_o^2(\sin^2\theta_1 - \cos^2\theta_1)}{(1 + P^2(s))} \right]^{1/2} - n_o \quad (18a)$$

TM Modes:

$$\Delta n = \left[ \frac{2n_o^2 \sin^2\theta}{1 - \sqrt{1 - 4\left(\frac{1-P(s)}{1+P(s)}\right) \sin^2\theta_1 \cos^2\theta_1}} \right]^{1/2} - n_o \quad (18b)$$

and P(s) is a function of the sidelobe level S given by $$P(s) = \left[ \frac{4}{N(1.172 - (3.65 \times 10^{-5})s + (4.705 \times 10^{-7})s^2)} \right] \quad (19)$$

Figure 11A:
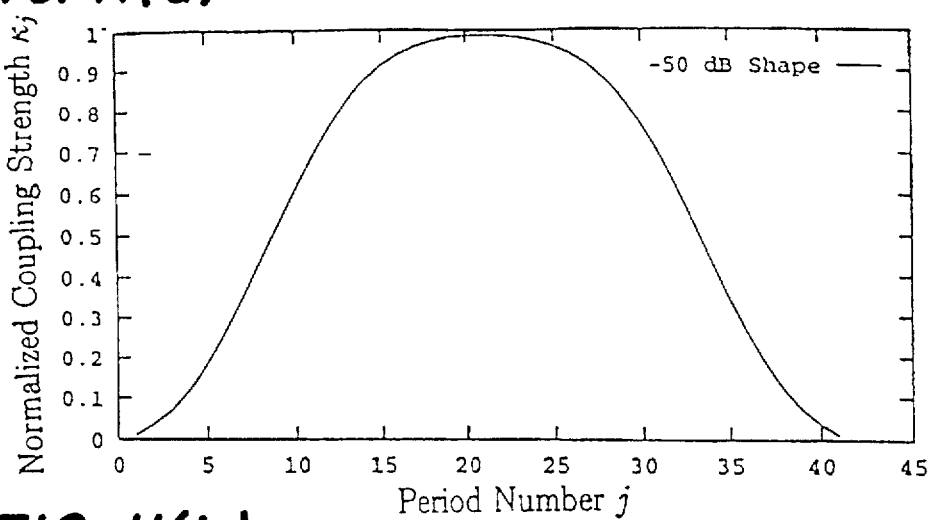
FIG. 11a, 11b and 11c show the filter function and spectral response for a multilayer planar reflection filter according the embodiment designed for −30 dB sidelobe suppression.
Figure 11B:
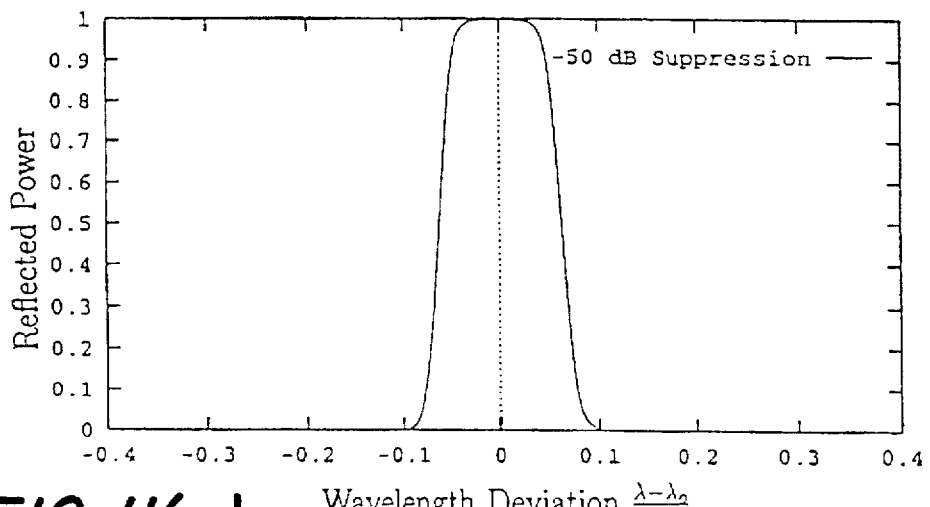
Figure 11C:
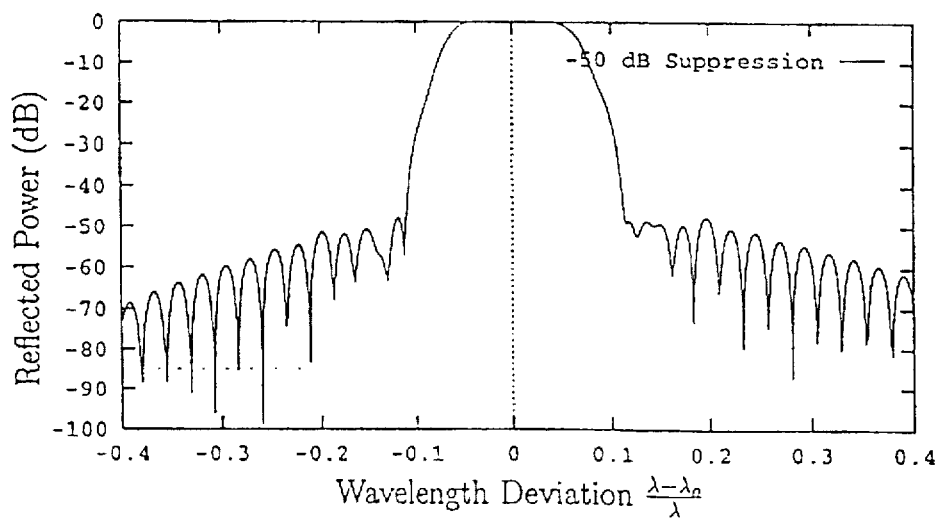
Figure 12A:
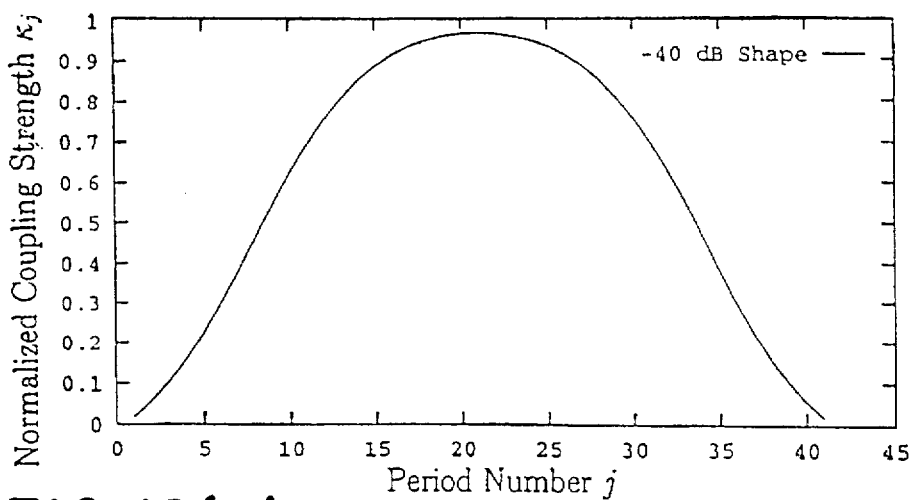
FIG. 12a, 12b and 12c show the filter function and spectral response for a multilayer planar reflection filter according the embodiment designed for −40 dB sidelobe suppression.
Figure 12B:
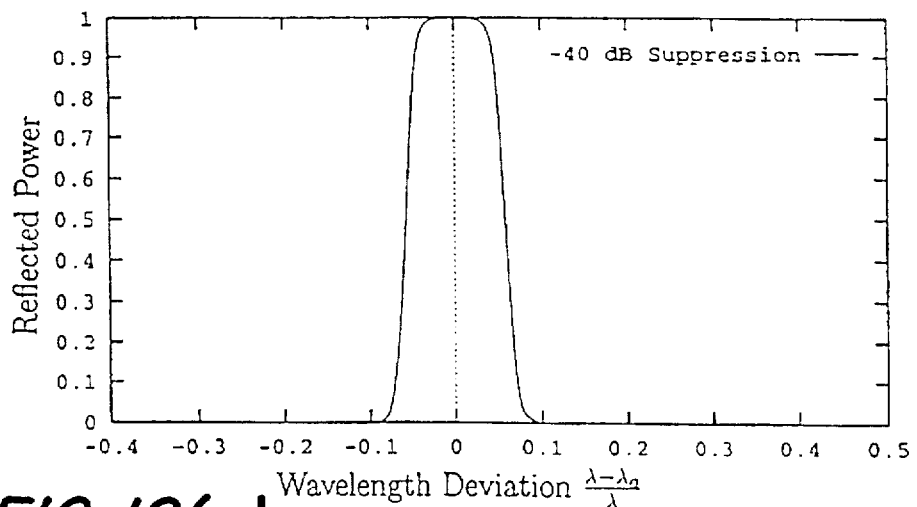
Figure 12C:
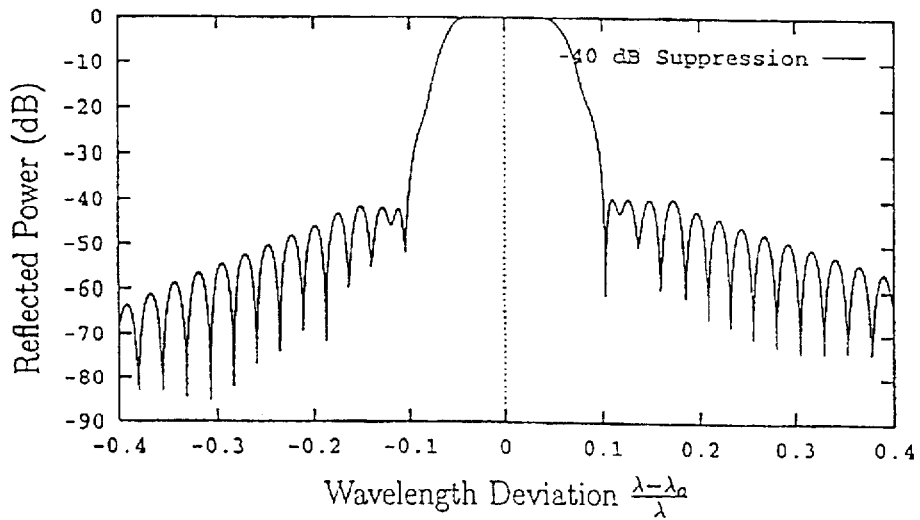
Figure 13A:
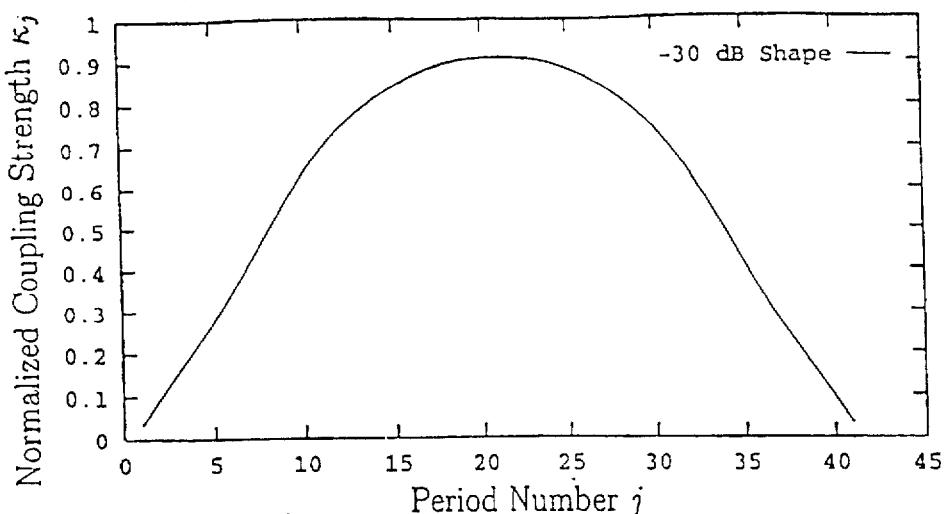
FIG. 13a, 13b and 13c show the filter function and spectral response for a multilayer planar reflection filter according the embodiment designed for −50 dB sidelobe suppression.
Figure 13B:
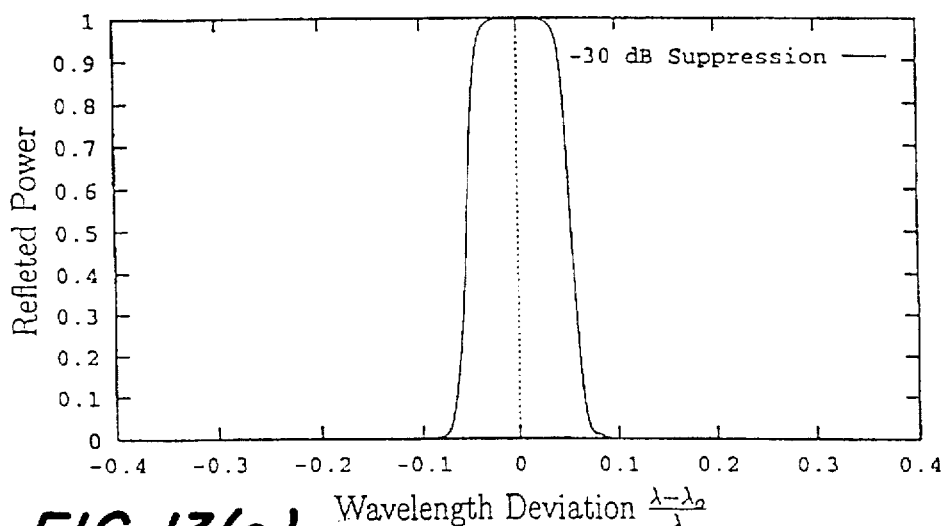
Figure 13C:
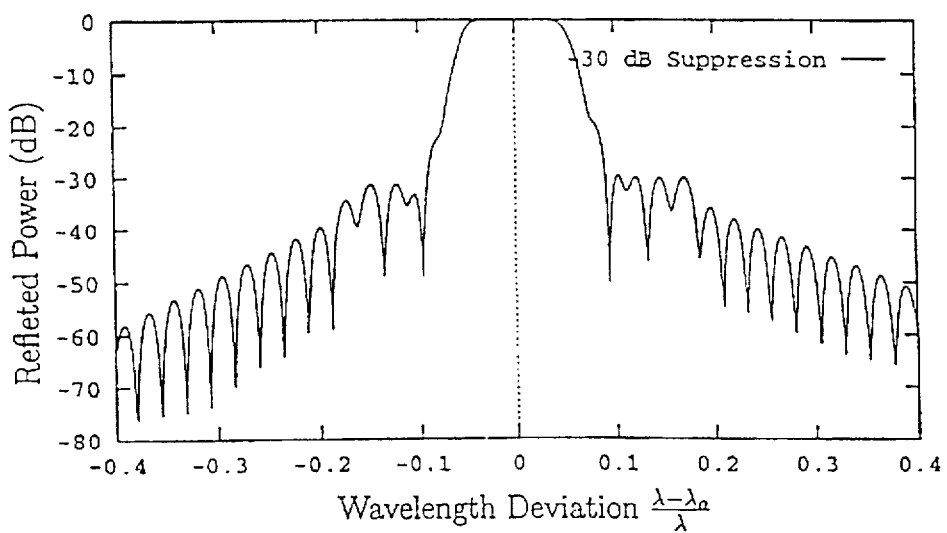

As examples, consider the case of N=41 periods. The coupling strengths and spectral response for multilayer reflection filters designed according to the embodiment for different levels (−30 dB, −40 dB, and −50 dB) of sidelobe suppression, respectively are shown in FIGS. 11, 12 and 13. The graphs of FIGS. 11a, 12a and 13a in these figures show the distribution of the normalized coupling strengths $\kappa_j$ for each filter. The graphs of FIGS. 11b and 11c, 12b and 12c, and 13b and 13c show the corresponding spectral responses for each filter, in linear and logarithmic form respectively. The abscissa of the graphs of FIGS. 11b, 12b and 13b and 11c, 12c and 13c are in units of normalized wavelength detuning $(\lambda_0-\lambda)/\lambda$.

The filter function and response for −30 dB sidelobe suppression is shown in FIG. 11a. The normalized coupling strengths $\kappa_j$ for each layer j of the 41 layer multilayer stack of the first embodiment. Reflected power response on a linear scale is shown in FIG. 11b and the reflected power response on a logarithmic scale is shown in FIG. 11c.

The filter function and spectral response for −40 dB sidelobe suppression, with normalized coupling strengths $\kappa_j$ for each layer j of a 41 layer multilayer stack are shown in FIGS. 12a, 12b and 12c respectively. The filter function and response for −50 dB sidelobe suppression with normalized coupling strengths $\kappa_j$ for each layer j of a 41 layer multilayer stack are shown in FIGS. 13a, 13b and 13c respectively.

Thus each of these filters shows near ideal spectral responses with strong sidelobe suppression and minimum narrow bandwidth.

These coefficients in Table 1 represent the optimized values to provide the specified filter response, but it is understood that small variations of these coefficients in practical devices will provide slightly less than optimized response. Correspondingly, other sets of coefficients may be determined by the variational optimization method described herein to provide other specified filter response characteristics.

What is claimed is:

1. A multilayer planar reflection filter having a filtered bandwidth at a selected central wavelength $\lambda_0$, and a specified out-of-band sidelobe suppression ratio S, the filter comprising:

a multilayer stack comprising N periods of alternating layers of a first dielectric medium of index $n_0$ and a second dielectric medium of index $n_0+\Delta n$, the value of N being odd, the thicknesses of each layer in period j of refractive index $n_0$ having a thickness $d_1(j)$, and of each layer in period j of refractive index $n_0+\Delta n$ having a thickness $d_2(j)$, for each period, j=1 through N, the layers of first dielectric medium and second dielectric medium are provided with respective thicknesses $d_1(j)$ and $d_2(j)$ $$d_1(j) = n_0 \left( \frac{\pi}{2} - \Delta\phi(j) \right) \frac{\lambda_0}{2\pi} \cos\theta_1$$

$$d_2(j) = (n_0 + \Delta n) \left( \frac{\pi}{2} + \Delta\phi(j) \right) \frac{\lambda_0}{2\pi} \cos\theta_2$$

where $\lambda_0$ is the central wavelength of the filtered bandwidth, and $\theta_1$ is the incident angle of the optical wave measured with respect to the normal of the stack, (in index $n_0$); the angle $\theta_2$ is the propagation angle in the layers with index $n_0+\Delta n$, related to $\theta_1$ by Snell's law $n_0 \sin\theta_1 = (n_0+\Delta n)\sin\theta_2$;

the values of $\Delta\phi(j)$ are specified by the design formulae $$\Delta\phi(j) = \cos^{-1}|\kappa(z_j)|$$

$$\kappa(z_j) = L_0(z_j) + SL_1(z_j) + S^2L_2(z_j)$$

and $$z_j = \frac{N+1-2j}{N},$$

where j is the jth period of the N period stack, S is the desired level of sidelobe suppression in absolute decibels |dB| in the range of 30 dB to 50 dB;

$L_k(z_j)$ are functions of coordinate $z_j$ given by $$L_k(k_j) = \sum_{i=0}^{5} b_{ki} \cos z_j\pi(i + 1/2)$$

and $b_{ki}$ are a set of constant coefficients.

4. A multilayer filter according to claim 3 wherein the constant coefficients $b_{ki}$ are:

| $b_{k,i}$ | 0 | 1 | 2 | 3 | 4 | 5 |
|---|---|---|---|---|---|---|
| $b_{0,i}$ | 0.8263 | −0.20689 | 4.28e-2 | −4.117e-2 | 5.993e-2 | −4.570e-2 |
| $b_{1,i}$ | 4.320e-3 | 9.064-3 | −2.645e-3 | 2.229e-3 | −2.681e-3 | 2.003e-3 |
| $b_{2,i}$ | −3.200e-5 | −6.579e-5 | 9.90e-6 | −2.342e-5 | 2.836e-5 | 2.158e-5 | whereby, for the specified sidelobe suppression ratio S, a minimum width of the filtered bandwidth is achieved.

2. A multilayer planar reflection filter having a filtered bandwidth at a selected central wavelength $\lambda_0$, and a specified out-of-band sidelobe suppression ratio S, the filter comprising:

a multilayer stack comprising N periods of alternating layers of a first dielectric medium of index $n_0$ and a second dielectric medium of index $n_0+\Delta n$, the value of N being arbitrary, but odd, the sidelobe suppression ratio being better than −30 dB, a layer in period j of refractive index $n_0$ having a thickness $d_1(j)$, and a layer in period j of refractive index $n_0+\Delta n$ having a thickness $d_2(j)$, the individual layers in period j of index $n_0$ and of index $n_0+\Delta n$ having respective thicknesses $d_1(j)$ and $d_2(j)$ whereby, for the specified sideband suppression ratio S, a minimum width of the filtered bandwidth is achieved.

3. A multilayer planar reflection filter according to claim 1 wherein the thicknesses $d_1(j)$ and $d_2(j)$ of the layers are defined by:

5. A multilayer reflection filter comprising a multilayer stack comprising N periods of alternating layers of dielectric media of index $n_0$ and a second dielectric medium of index $n_0+\Delta n$, wherein the magnitude of the power reflection coefficient is 99.9% at $\lambda_0$ the center of the stopband and is provided by placing the following constraint on the index contrast $\Delta n$, the incident angle $\theta_1$, and the number of layers N:

TE Modes:

$$\Delta n = \left[ \frac{n_0^2(1 + P^2(s)) + 2P(s)n_0^2(\sin^2\theta_1 - \cos^2\theta_1)}{(1 + P^2(s))} \right]^{1/2} - n_0$$

TM Modes:

$$\Delta n = \left[ \frac{2n_0^2 \sin^2\theta_1}{1 - \sqrt{1 - 4\left(\frac{1-P(s)}{1+P(s)}\right)\sin^2\theta_1 \cos^2\theta_1}} \right]^{1/2} - n_0$$

and P(s) is a function of the sidelobe level S given by $$P(s) = \left[ \frac{4}{N(1.172 - (3.65 \times 10^{-5})s + (4.705 \times 10^{-7})s^2)} \right]$$

6. A channel dropping filter for a wavelength division multiplexing system, comprising

- a series of filter elements provided by multilayer planar reflection filters, each multilayer reflection filter having a spectral response at a different central wavelength, sidelobe suppression greater than −30 dB and minimum width for the filtered bandwidth, comprising:
- a multilayer stack comprising N periods of alternating layers of dielectric media of index $n_0$ and a second dielectric medium of index $n_0 + \Delta n$, the value of N being arbitrary and odd,
- the thicknesses of each layer of each period j of refractive index $n_0$ having a thickness $d_1(j)$, and each layer of period j in refractive index $n_0 + \Delta n$ having a thickness $d_2(j)$,
- the thicknesses of each layer $d_1(j)$ and $d_2(j)$ being selected to provide a filtered bandwidth at a selected central wavelength $\lambda_0$, a specified out-of-band sidelobe suppression ratio S, and a minimum width of the filtered bandwidth for the specified level of sidelobe suppression.

* * * * *